United States Patent [19]

Agrawal et al.

[11] Patent Number: 5,185,706
[45] Date of Patent: Feb. 9, 1993

[54] PROGRAMMABLE GATE ARRAY WITH LOGIC CELLS HAVING CONFIGURABLE OUTPUT ENABLE

[75] Inventors: Om P. Agrawal, San Jose, Calif.; Michael J. Wright, Boulder, Colo.

[73] Assignee: Advanced Micro Devices, Inc., Sunnyvale, Calif.

[21] Appl. No.: 503,049

[22] Filed: Apr. 2, 1990

Related U.S. Application Data

[60] Continuation-in-part of Ser. No. 442,528, Nov. 27, 1989, which is a division of Ser. No. 394,221, Aug. 15, 1989.

[51] Int. Cl.[5] ............................................. H01L 27/10
[52] U.S. Cl. .................................. 364/489; 364/488; 340/825.83; 307/465
[58] Field of Search ............... 364/488, 489, 490, 491; 307/465; 340/825.79, 825.83, 825.87

[56] References Cited

U.S. PATENT DOCUMENTS

| | | | |
|---|---|---|---|
| 4,642,487 | 2/1987 | Carter | 307/465 |
| 4,668,880 | 5/1987 | Shoji | 364/488 |
| 4,675,673 | 6/1987 | Oliver | 364/488 |
| 4,706,216 | 11/1987 | Carter | 365/94 |
| 4,713,557 | 12/1987 | Carter | 307/242 |
| 4,758,985 | 7/1988 | Carter | 365/94 |
| 4,786,904 | 11/1988 | Graham, III et al. | 364/488 |
| 4,845,633 | 7/1989 | Furtek | 364/490 |
| 4,931,946 | 6/1990 | Ravindra et al. | 364/490 |
| 5,036,473 | 7/1991 | Butt et al. | 364/490 |

OTHER PUBLICATIONS

"The Programmable Gate Array Design Handbook"; 1st Ed.; published by Xilinx; pp. 1—1 to 1-31.
"XC3000 Logic Cell Array Family"; Published by Xilinx; p. 1-31 (FIG. 15b).

Primary Examiner—Vincent N. Trans
Attorney, Agent, or Firm—Fliesler, Dubb, Meyer & Lovejoy

[57] ABSTRACT

A configurable logic array, includes a plurality of configurable logic cells which include a tristate output buffer, having an input receiving a logic signal from within the configurable logic cell, an output connected to the configurable interconnect structure and an output enable input. A plurality of selectors, controlled by the configuration memory, supply output enable signals for controlling corresponding tristate output buffers. The inputs to the plurality of selectors include a "common output enable signal," and at least a second logic signal, such as a constant high or constant low logic level. A circuit responsive to program data in the configuration memory and input signals from the interconnect structure generates the common output enable signal. One input of the selector is provided by an invertor connected from the input of the tristate output buffer to the selector for connecting an output signal to a long line in a wired-AND configuration.

23 Claims, 8 Drawing Sheets

PROGRAMMABLE GATE ARRAY WITH LOGIC CELLS HAVING CONFIGURABLE OUTPUT ENABLE

CONTINUING APPLICATION DATA

The present application is a continuation-in-part of U.S. patent application Ser. No. 07/442,528, filed Nov. 27, 1989, entitled PROGRAMMABLE GATE ARRAY WITH IMPROVED CONFIGURABLE LOGIC BLOCK, which is the divisional of U.S. patent application Ser. No. 07/394,221 filed Aug. 15, 1989, entitled PROGRAMMABLE GATE ARRAY WITH IMPROVED INTERCONNECT STRUCTURE.

BACKGROUND OF THE INVENTION

1. Field of the Invention

The present invention relates to programmable gate arrays which include an array of configurable logic cells, a plurality of input/output cells, and a configurable interconnect structure. More particularly, the present invention relates to programmable gate arrays with logic cells having individually configurable output enable circuits.

2. Description of Related Art

The programmable gate array is a high performance, user programmable device containing three types of configurable elements that are customized to a user's system design. The three elements are (1) an array of configurable logic blocks (CLBs), (2) with input/output blocks (IOBs) around a perimeter, all linked by (3) a flexible programmable interconnect structure.

The system design desired by a user is implemented in the device by configuring programmable RAM cells. These RAM cells control the logic functionality performed by the CLBs, IOBs and the interconnect. The configuration is implemented using PGA design software tools.

It is generally accepted that the programmable gate array was first, successfully, commercially introduced by Xilinx of San Jose, Calif. Xilinx originally introduced the XC2000 series of logic cell arrays and has more recently introduced a second generation XC3000 family of integrated circuit programmable gate arrays. A description of the 2000 series, as well as related programmable logic device art, can be found in THE PROGRAMMABLE GATE ARRAY DESIGN HANDBOOK, First Edition, published by Xilinx, pages 1-1 through 1-31. The architecture for the XC3000 family is provided in a technical data handbook published by Xilinx entitled XC3000 LOGIC CELL ARRAY FAMILY, pages 1-31. (See, in particular, FIG. 15b re three-state buffers in the interconnect structure.) Each of these Xilinx publications is incorporated by reference in this application as providing a description of the prior art.

The prior art in programmable gate arrays is further exemplified by U.S. Pat. Nos. 4,642,487; 4,706,216; 4,713,557; and 4,758,985; each of which is assigned to Xilinx, Inc. These U.S. Patents are incorporated by reference as setting forth detailed descriptions of the programmable gate array architecture and implementations of the same.

As mentioned above, the programmable gate array consists of a configurable interconnect, a ring of configurable input/output blocks, and an array of configurable logic blocks. It is the combination of these three major features that provides flexibility and data processing power for programmable gate arrays. However, the programmable gate arrays of the prior art suffer certain limitations in each of the interconnect structure, the input/output block structures, and the configurable logic block structures.

One of the limitations resides in the flexibility of the connections from outputs of the configurable logic cells to the interconnect structure. For instance, it is often desirable to have a tristatable output with an output enable logic, in certain parts of a network. Prior art systems have distributed tristate buffers in the interconnect structure to serve this purpose. However, utilization of the interconnect structure to reach the tristate buffers, and the limited number of tristate buffers, have increased the complexity of programming the programmable gate arrays implemented in this manner.

Accordingly, it is desirable to implement the logic cells in the programmable gate array with flexible, programmable output structures for connection to the configurable interconnect.

SUMMARY OF THE INVENTION

The present invention increases the flexibility of connection between the configurable logic cells and the interconnect structure. According to one aspect, the invention comprises an integrated circuit, including a plurality of configurable logic cells which include a tristate output buffer, having an input receiving a logic signal from within the oonfigurable logic cell, an output connected to the configurable interconnect structure and an output enable input. The tristate output buffer supplies an output signal to the configurable interconnect or presents a high impedance state on the output in response to an output enable signal connected to the output enable input. In addition, the logic cell includes a configurable circuit responsive to program data in the configuration memory and input signals from the interconnect structure for generating a common output enable signal. A plurality of selectors, each having a plurality of inputs and an output connected to a respective one of the tristate output buffers, supplies the output enable signals for controlling corresponding tristate output buffers. The inputs to the plurality of selecting means include the common output enable signal, and at least a second logic signal, such as a constant high or constant low logic level. In addition, according to another aspect of the invention, one input of the selector is provided by an invertor connected from the input of the tristate output buffer to the selector.

According to another aspect, the invention comprises a oonfigurable logic array including an interconnect structure that has a conductive line, such as have been referred to as long lines in the prior art. Each member of a subset of the logic elements in the configurable logic array includes an output circuit for connecting an output signal to the conductive line in a wired-logic configuration, such as wired-AND.

Other aspects and advantages of the present invention can be seen upon review of the drawings, the detailed description and the claims that follow.

DETAILED DESCRIPTION

I. Layout and Programming Structure

Figure 1:
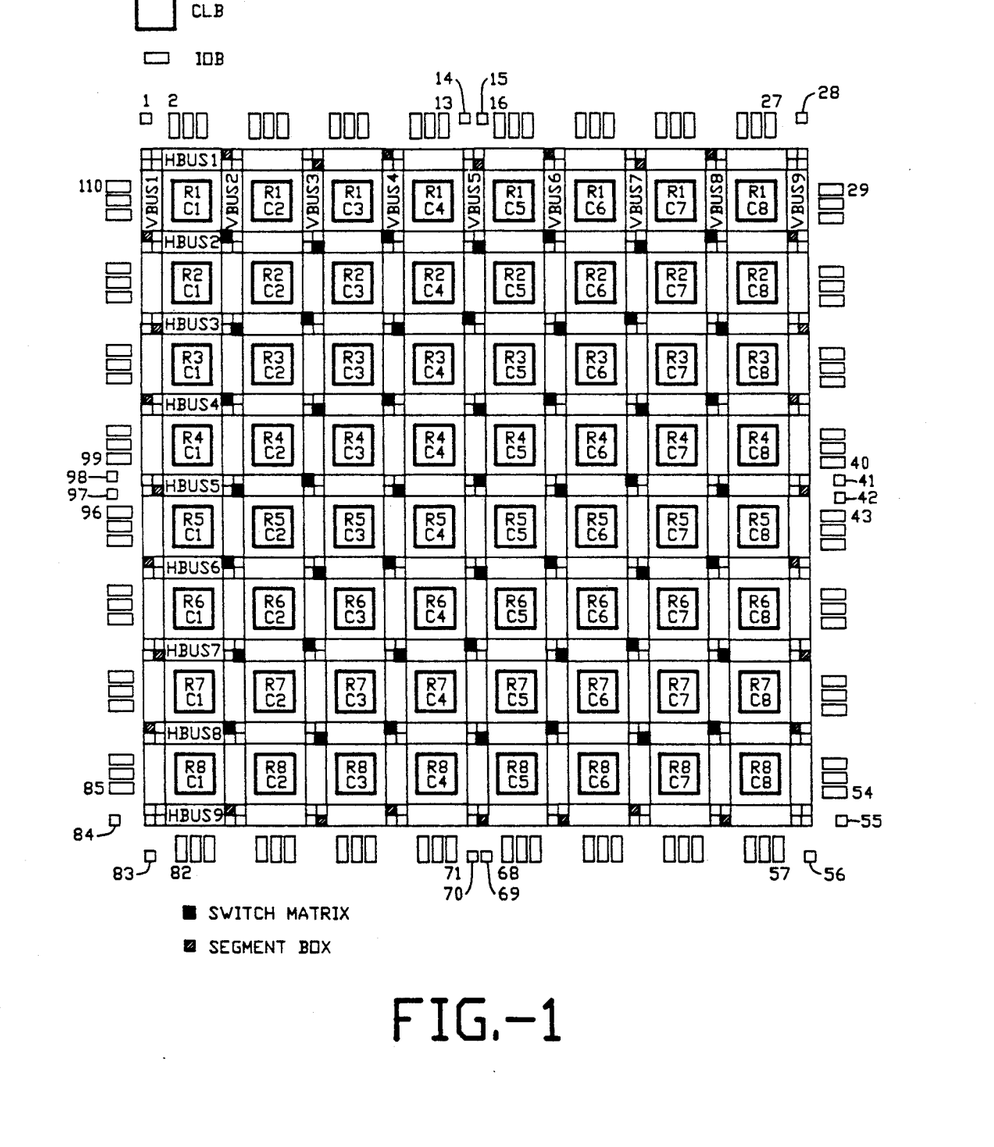
FIG. 1 is a schematic diagram of a programmable gate array structure according to the present invention.

FIG. 1 illustrates the layout of the configurable logic array integrated circuit according to the present invention. Also provided in FIG. 1 is a notation which is utilized to describe the oonfigurable logic array in this application. Accordingly, the configurable logic array shown in FIG. 1 consists of an array of configurable logic blocks illustrated by the square symbol with bold lines shown at the upper left hand corner of the figure. Each configurable logic block in the array is labeled with a row and column number, i.e. in the upper left hand corner of the array, the configurable logic blocks are labeled R1C1, R1C2, and so on until the lower right hand corner of the array where the configurable logic block is labeled R8C8.

Around the periphery of the array are 110 pads for connection to external pins. Pads 2-13, 16-27, 29-40, 43-54, 57-68, 71-82, 85-96 and 99-110 are coupled to configurable input/output blocks represented by the symbol shown in the upper left hand corner of the figure. Pads 1, 14, 15, 28, 41, 42, 55, 56, 69, 70, 83, 84, 79 and 98 are utilized for functions other than configurable input/output blocks, such as power, ground, global clock and reset signal inputs, and programming mode control signals. The connection of these miscellaneous pads is similar to that done in prior art programmable gate arrays and is not further described here.

The interconnect structure consists of nine horizontal buses labeled HBUS1 through HBUS9 with nine intersecting vertical buses VBUS1 through VBUS9. The intersections of vertical bus 1 and vertical bus 9 with the horizontal buses 2-8 are characterized by having segment boxes which provide programmable interconnection between the respective horizontal buses and vertical buses as described in detail below. Likewise, the intersections of horizontal bus and horizontal bus 9 with vertical buses 2-8 are characterized by segment boxes providing the programmable interconnection between the horizontal and vertical buses.

The intersections of the vertical buses 2-8 with the horizontal buses 2-8 are characterized by switching matrices providing for interconnection between the respective horizontal and vertical buses. The placement of the segment boxes and switching matrices is schematically illustrated in FIG. 1 using the symbols illustrated in the lower left hand corner of the figure. The detailed structure of the switching matrices and segment boxes is described below.

The configurable logic array according to the present invention contains three types of configurable elements that are customized to a user system design which is specified in a configuration memory. The three configurable elements are the array of configurable logic blocks (CLBs), the oonfigurable input/output blocks (IOBs) around the perimeter, and the programmable interconnect network.

The system design of a user is implemented in the programmable gate array by configuring programmable RAM cells known as a configuration memory. These RAM cells control the logic functionality performed by the CLBs, IOBs, and the interconnect. The loading of the configuration memory is implemented using a set of design software tools as well known in the art.

The perimeter of configurable IOBs provide a programmable interface between the internal logic array and device package pins. The array of CLBs performs user specified logic functions. The interconnection consists of direct connections between specific CLBs or IOBs, and a general connect that is programmed to form networks carrying logic signals among the blocks.

The logic functions performed by the CLBs are determined by programmed lookup tables in the configuration memory. Functional options are performed by program controlled multiplexers. Interconnecting networks between blocks are composed of metal segments joined by programmable interconnect points (PIPs).

The logic functions, functional options, and interconnect networks are activated by a program data which is loaded into an internal distributed array of configuration memory cells. The configuration bit stream is loaded in to the device at power up and can be reloaded on command.

Figure 2:
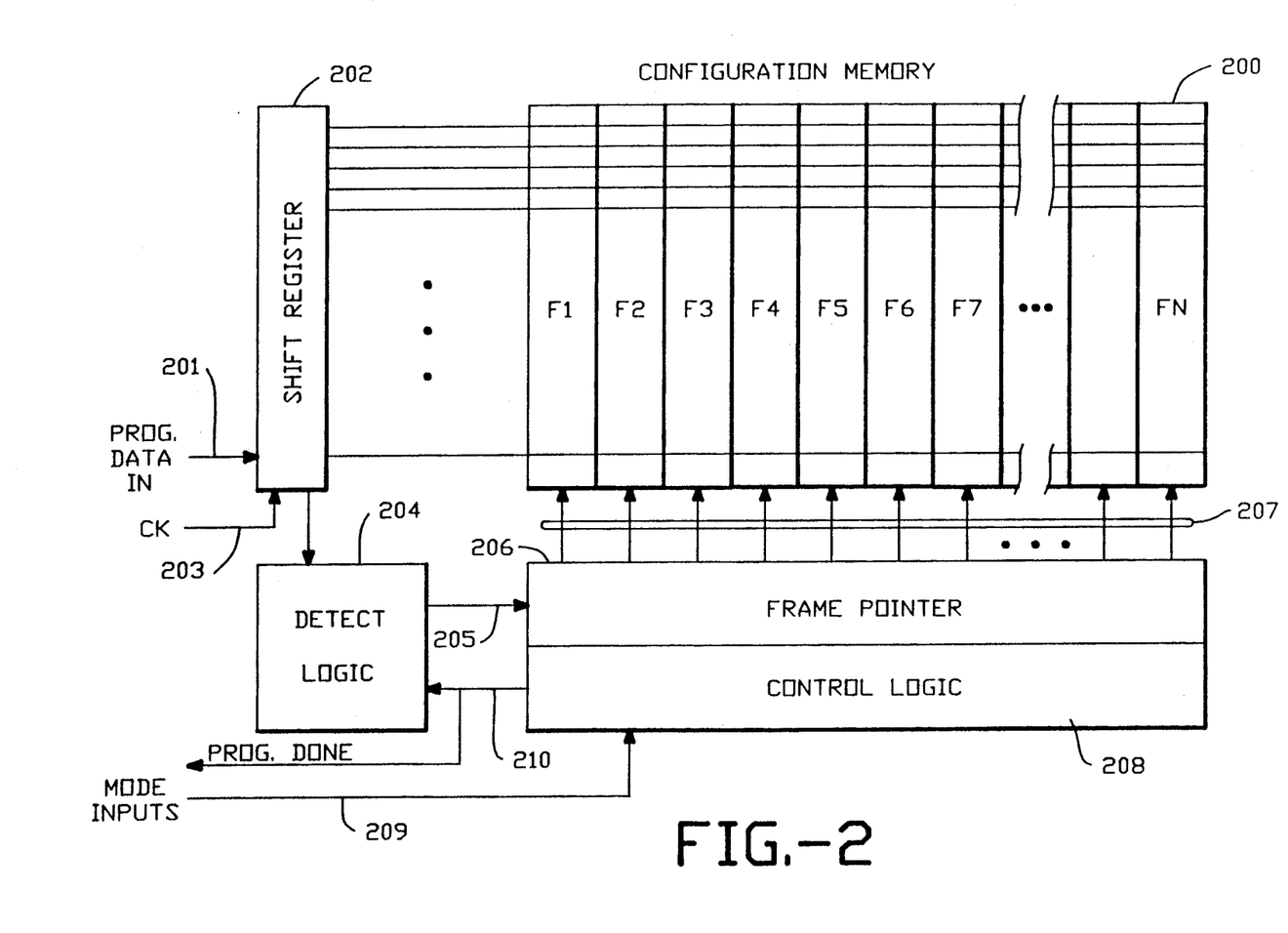
FIG. 2 is a schematic diagram of the configuration memory according to the present invention.

FIG. 2 is a schematic diagram of the oonfigurable logic array as seen by the program data. The array includes a plurality of distributed memory cells referred to as the configuration memory 200. Program data on line 201 is loaded into shift register 202 in response to a clock signal on line 203. The detect logic 204 determines when the shift register is full by reading a preamble from data on 201. When the shift register is full, the detect logic 204 signals across line 205 a frame pointer logic 206 which generates frame pointer signals across lines 207. Control logic 208 is responsive to the mode inputs to the device on line 209 to control the detect logic 204 across line 210 and the frame pointer during loading of the configuration memory 200.

The configuration memory 200 is organized into a plurality of frames F1-FN. As program data is loaded into the shift register, the frame pointer F1 is activated to load the first frame in the configuration memory. When the shift register is loaded with the second frame of data, the frame pointer for F2 is activated, loading the second frame F2, and so on until the entire configuration memory is loaded. Control logic 208 generates a program done signal on line 210.

II. General Interconnect Structure

Figure 3:
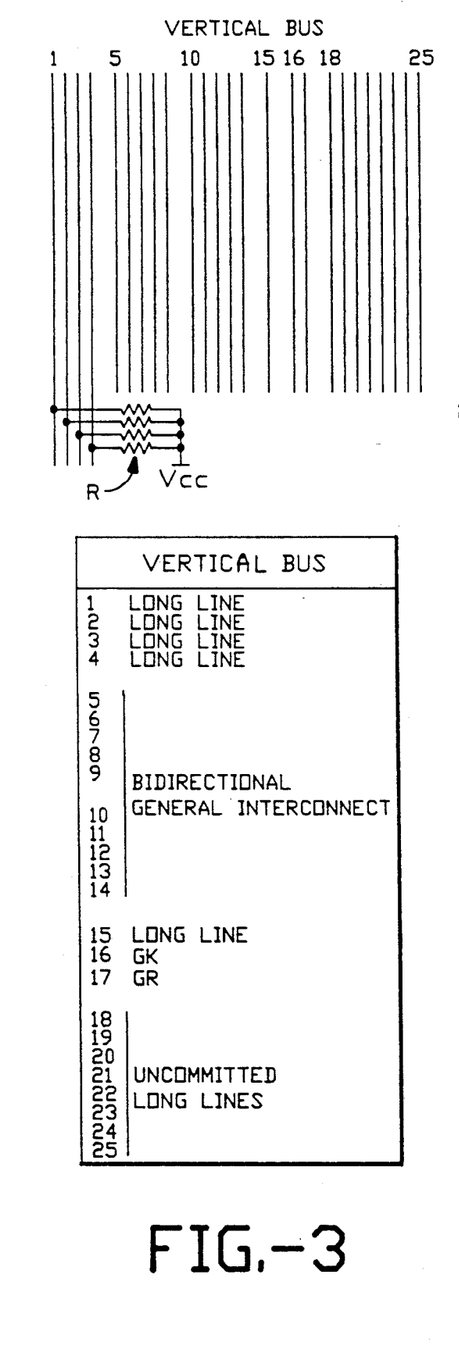
FIG. 3 is a diagram illustrating nomenclature for the vertical bus, and the use of pull up resistors on long lines of the vertical bus.

FIG. 3 illustrates the notation used for the vertical buses. Each vertical bus has 25 lines. Lines 1-4 and 15-17 are long lines which run across the entire array. Lines 1-4 have pull up resistors (shown schematically at R) connected to a logic high voltage VCC to establish a normally high state on the long lines. Lines 5-14 consist of bidirectional general interconnect (BGI) segments which are coupled through switching matrices and segment boxes as described below. Lines 18-25 are uncommitted long lines which run the entire length of the array. The long lines 15-17, the uncommitted long lines 18-25, and the BGI segments 5-14 could also have pull up resistors establishing a normally high state, if desired.

Figure 4:
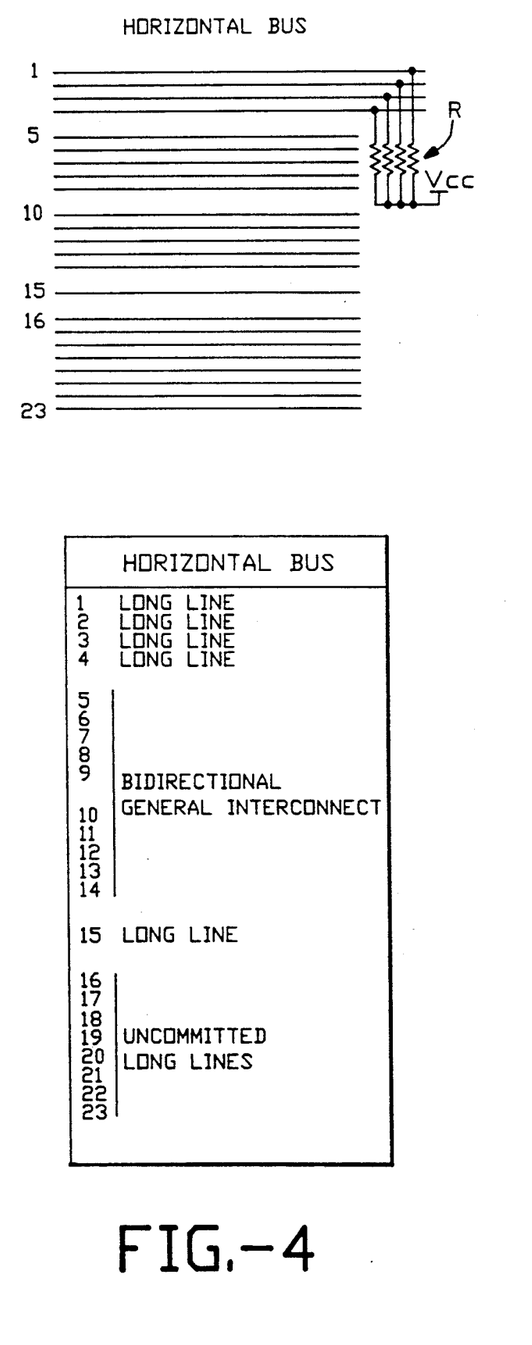
FIG. 4 is a diagram illustrating nomenclature for the horizontal buses and illustrating the pull up resistors used on long lines of the horizontal buses.

FIG. 4 illustrates the notation used for the horizontal buses. Each horizontal bus is a 23 line bus in which lines 1-4 and 15 are long lines. Lines 1-4 are coupled to pull up resistors R. Lines 5-14 are BGI segments, and lines 16-23 are uncommitted long lines. As with the horizontal buses, lines or segments other than long lines 1-4 could be coupled to pull up resistors, if desired.

Long lines are characterized by extending across the array, and being coupled through programmable interconnect points to specific inputs and outputs of the configurable logic cells and input/output cells and to lines on intersecting buses. The BGI segments are characterized by having terminations in segment boxes or switching matrices, rather than extending across the entire array, as well as by being coupled through programmable interconnect points to specific inputs and outputs of the configurable logic cells and input/output cells. The uncommitted long lines are characterized by extending across the array and by being coupled through programmable interconnect points to specific outputs of configurable logic cells and input/output cells, to BGI segments, and to long lines; and no connections committing the lines to specific inputs of configurable logic cells or input/output cells.

In order to construct networks through a device, the horizontal and vertical buses require means of interconnection. This occurs at the intersections of the horizontal buses and the vertical buses. The interconnections between the lines at the intersection are made through programmable interconnect points, switch matrices, and segment boxes.

III. Configurable Logic Block and Tristate Output Connections

Figure 5:
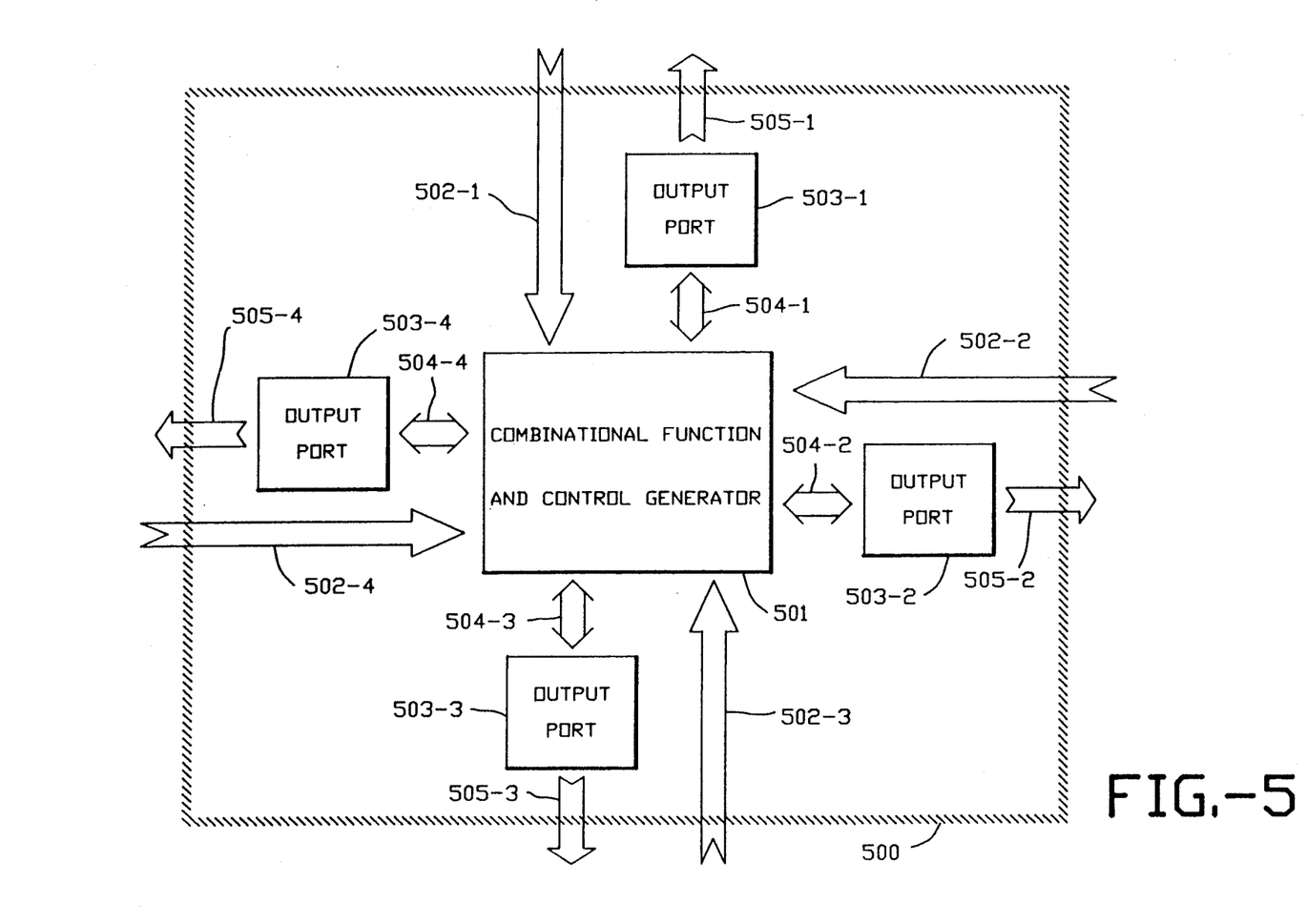
FIG. 5 is a schematic diagram of a configurable logic cell according to the present invention.

The configurable logic block 500 shown in FIG. 5 consists of a combinational function and control generator 501 which receives inputs from four sides, schematically illustrated by buses 502-1, 502-2, 502-3, and 502-4. The combinational function and control generator 501 communicates with four independently configurable output ports (macrocells) 503-1, 503-2, 503-3, and 503-4. The output ports receive signals and supply feedback signals to and from the combinational function and control generator 501 across respective buses 504-1, 504-2, 504-3, and 504-4. Each output port supplies a plurality of output signals, schematically illustrated by the respective output buses 505-1, 505-2, 505-3, and 505-4 to the configurable interconnect structure.

The block diagram of FIG. 5 illustrates at a high level the symmetry of the configurable logic block 500. Input signals can be received from all four sides of the block, likewise, output signals can be supplied to any of the four sides of the block. Furthermore, as seen below, input signals from the input bus 502 can be used to generate output signals across bus 505-1, 505-2, 505-3, or 505-4. Similar flexibility is provided from all of the other input buses in the configurable logic block.

Figure 6:
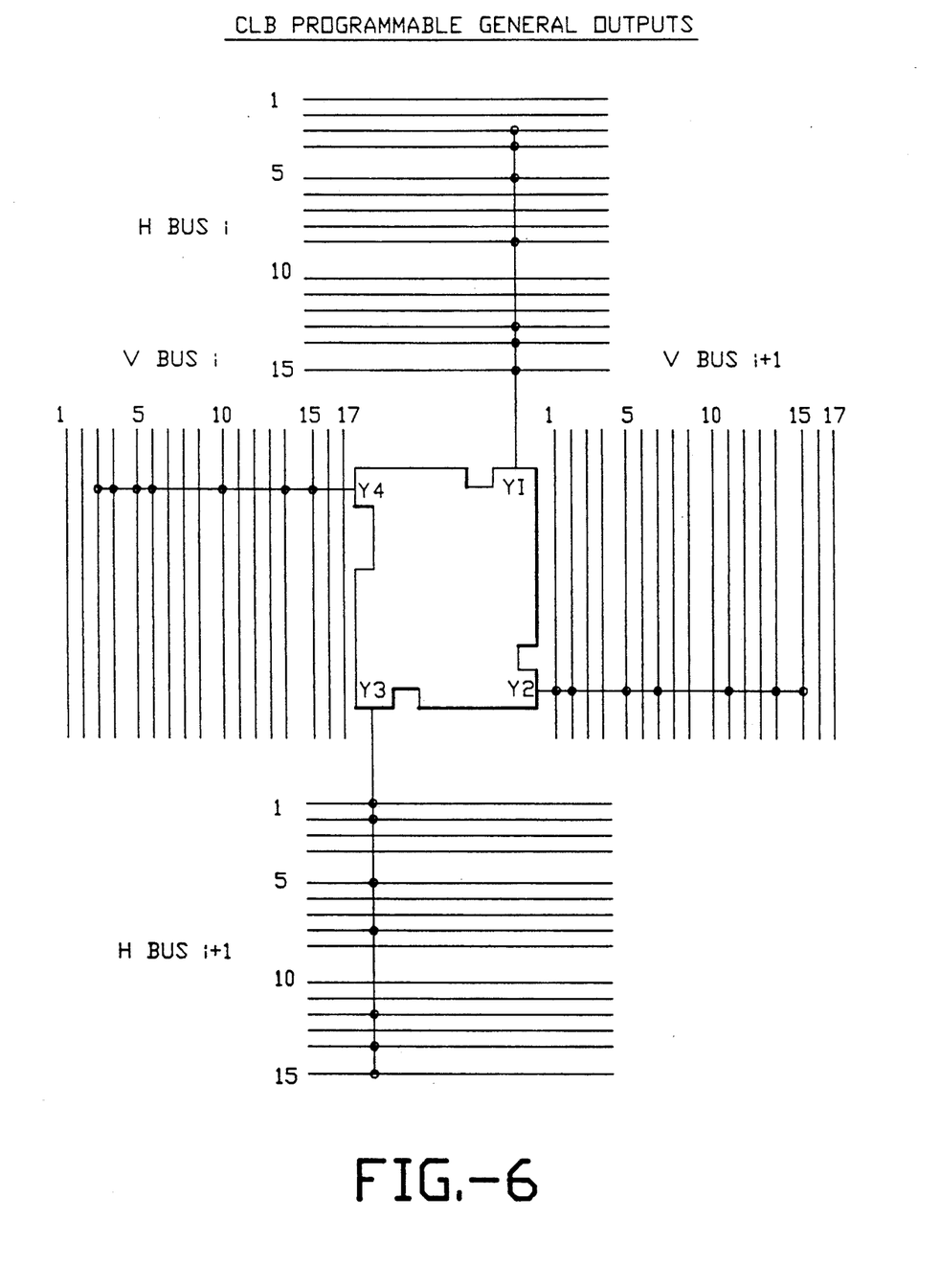
FIG. 6 illustrates connections of the tristatable outputs of the configurable logic cells to the long lines and bidirectional general interconnect of the interconnect structure according to the present invention.
Figure 7:
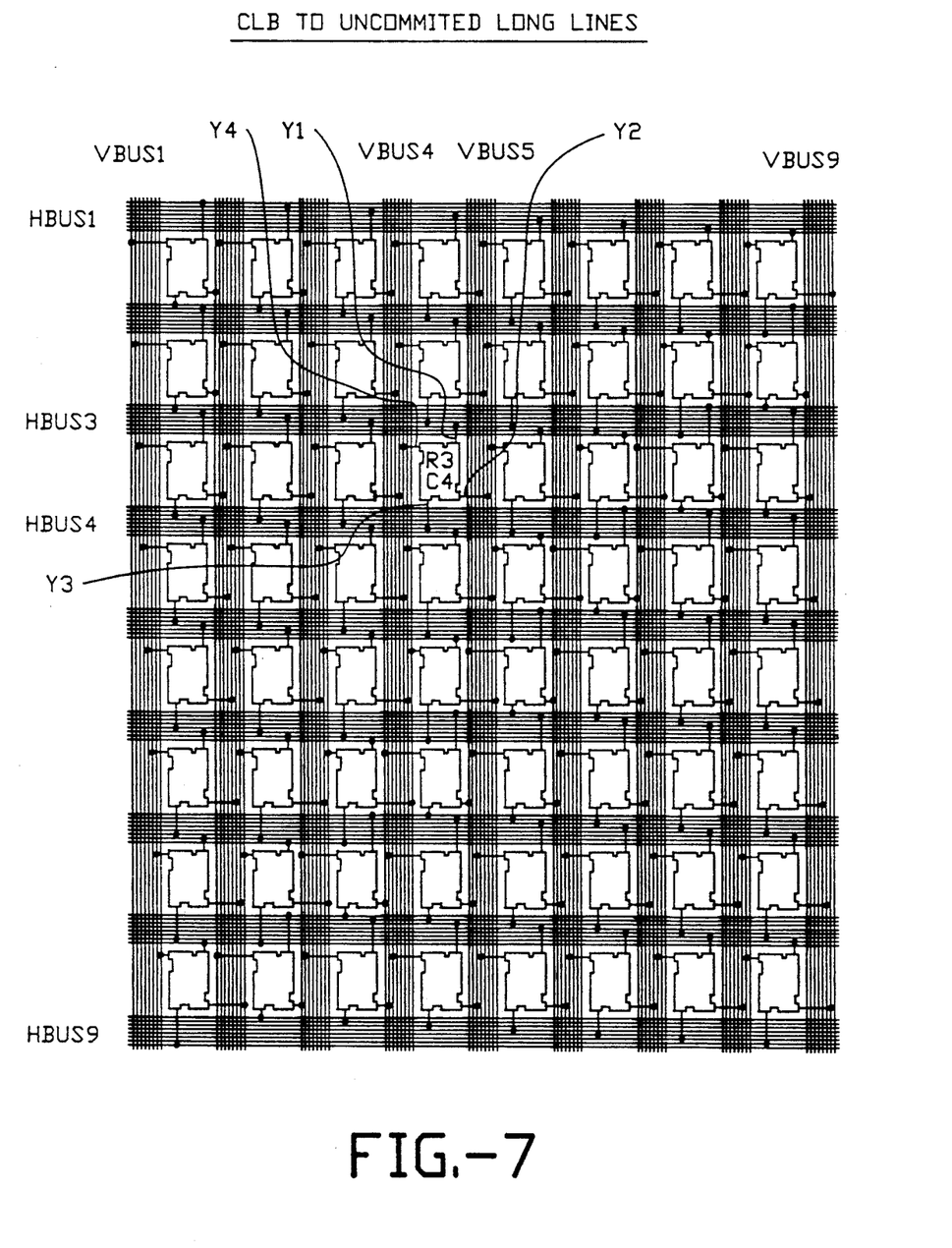
FIG. 7 illustrates connection of the tristatable outputs to the uncommitted long lines according to the present invention.

FIG. 6 shows the programmable connections of the outputs Y1 through Y4 to the long lines and BGI. The outputs Y1 through Y4 are also connected to the uncommitted long lines as shown in FIG. 7. Also, the outputs are coupled differently to the vertical bus 1 and horizontal bus 1, vertical bus 9 and horizontal bus 9 as it relates to the long lines 1-4 in the respective buses, as shown in the parent application Ser. No. 07/442,528.

FIG. 6 shows that the output Y1 is coupled to PIPs associated with long lines 3, 4, and 15, and BGIs 5, 9, 13, and 14 in HBUS i. The output Y2 of CLB CiRi is coupled to VBUS i+1 long lines 1, 2 and 15, and BGIs 5, 7, 11, and 14. Output Y3 of CiRi is coupled to HBUS i+1 long lines 1, 2, and 15, and to BGI lines 5, 8, 12, and 14. The output Y4 of CiRi is coupled to VBUS i long lines 3, 4, and 15, and to BGI 5, 6, 10, and 14.

The connection of the configurable logic blocks to the uncommitted long lines is shown in FIG. 7. Each CLB, such as CLB R3C4, has outputs Y1 through Y4 coupled to one uncommitted long line each. The connections will not be recited because they are shown in FIG. 7. In FIG. 7, only lines 18-25 of the vertical buses, and lines 16-23 of the horizontal buses are shown, because these are the only uncommitted long lines. In order to provide an example for reading FIG. 7, the CLB R3C4 output Y1 is coupled to uncommitted long line 21 of HBUS 3. The output Y2 of R3C4 is coupled to uncommitted long line 23 of VBUS 5. The output Y3 is coupled to uncommitted long line 21 of HBUS 4. The output Y4 is coupled to uncommitted long line 23 of VBUS 4. Note that the uncommitted long lines do not have programmable connections to inputs of CLBs. The selection of the connections of the outputs of the uncommitted long lines has been carried out to achieve a distributed uniform pattern that facilitates programming of nets through the array.

IV. CLB Output Macrocells

The output macrocells for the configurable logic block are shown in FIGS. 8-11. The inputs to these macrocells are labelled using the conventions of the parent application Ser. No. 07/442,528. For the purpose of the present invention, it suffices that such signals are generated within the oonfigurable logic cell in response to inputs to the cell from the configurable interconnect and the program data in the configuration memory.

Figure 8:
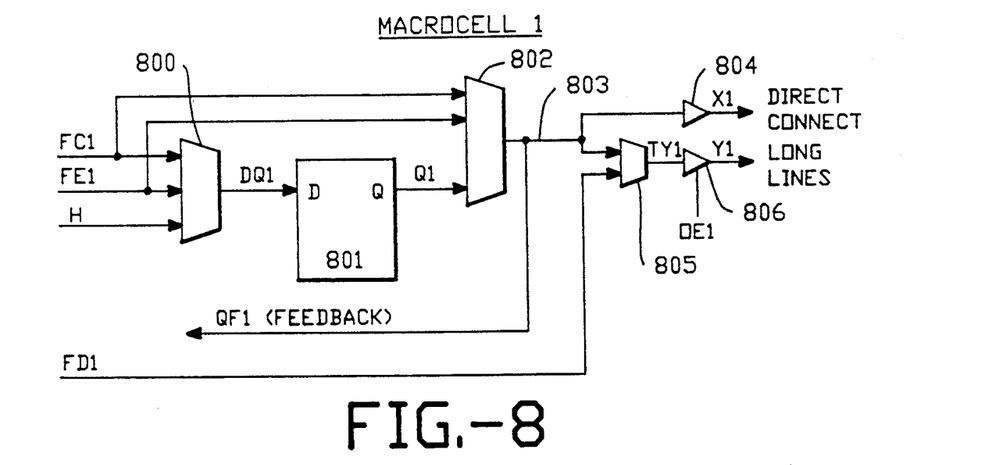
FIG. 8 is a schematic diagram of a first output macrocell in a configurable logic cell according to the present invention.

The macrocell in FIG. 8 supplies signals to outputs X1 and Y1 of the configurable logic block. Inputs to the macrocell include FC1, FE1, H and FD1 generated within the CLB. The inputs FC1, FE1 and H are coupled to multiplexer 800. The output DQ1 of multiplexer 800 is supplied as a D input to register 801. The output Q1 of register 801 is coupled as an input to multiplexer 802. Two additional inputs to multiplexer 802 include FC1 and FE1. The output of multiplexer 802 is coupled to line 803. Line 803 supplies the signal QF1 as feedback to the combinational logic. Likewise, it is coupled directly to an output buffer 804 for driving the output signal X1 for the direct connect.

Signal 803 is also coupled to multiplexer 805. The second input to multiplexer 805 is a signal FD1. The output TY1 of multiplexer 805 is coupled to a tristate output buffer 806. The output of buffer 806 is the Y1 signal for connection to the interconnect structure as shown in FIGS. 6 and 7. The tristate buffer 806 is controlled by the control signal OE1 generated within the configurable logic block as described below with reference to FIG. 12.

Figure 9:
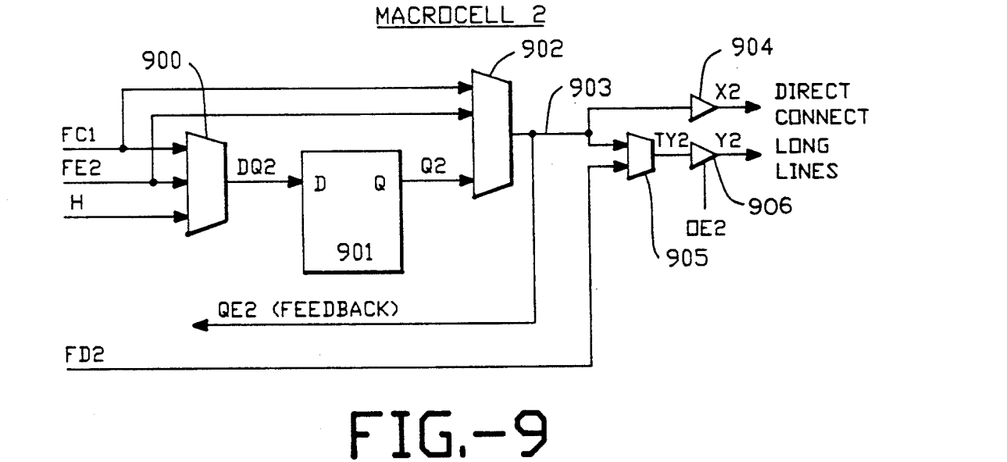
FIG. 9 is a schematic diagram of a second output macrocell in a configurable logic cell according to the present invention.

FIG. 9 shows the macrocell supplying signals to the outputs X2 and Y2. The inputs to macrocell 2 in FIG. 9 include FC2, FE2, H, and FD2 generated within the CLB. FC2, FE2, and H are supplied through multiplexer 900 to generate the signal DQ2. DQ2 is supplied to register 901. The output Q2 of register 901 is supplied as an input to multiplexer 902. Other inputs to multiplexer 902 include FC2 and FE2. The output QF2 of multiplexer 902 is supplied on line 903 as feedback and directly to output buffer 904 supplying the signal X2 to the direct connect.

The signal on line 903 is also supplied to multiplexer 905. The second input to multiplexer 905 is the signal FD2. The output TY2 of multiplexer 905 is supplied as an input to tristate output buffer 906, which drives the signal Y2. Tristate buffer 906 is controlled by control signal OE2.

Figure 10:
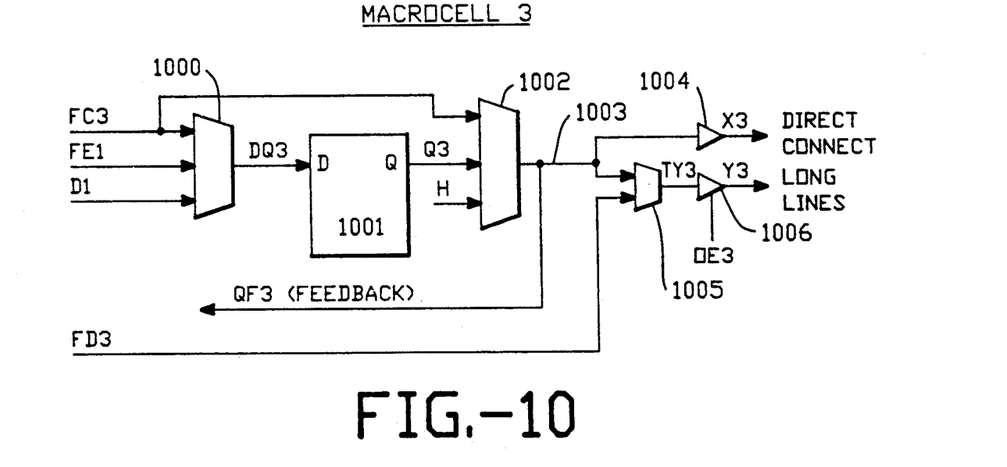
FIG. 10 is a schematic diagram of a third output macrocell in a configurable logic cell according to the present invention.

The output macrocell of FIG. 10 drives signals to outputs X3 and Y3. Its inputs include the signals FC3, FE1, D1, H and FD3 generated within the CLB. The inputs FC3, FE1, and D1 are coupled through multiplexer 1000 to supply the signal DQ3. Signal DQ3 is coupled to register 1001. The output Q3 of register 1001 is supplied as an input to multiplexer 1002. Two other inputs to multiplexer 1002 include FC3 and H. The output QF3 of multiplexer 1002 is supplied on line 1003 as feedback and directly to the buffer 1004 which drives the signal X3. Also, the signal on line 1003 is supplied to multiplexer 1005. The second input to multiplexer 1005 is signal FD3. The output TY3 of multiplexer 1005 is supplied to the tristate buffer 1006 driving the signal Y3. The tristate buffer 1006 is controlled by the signal OE3.

Figure 11:
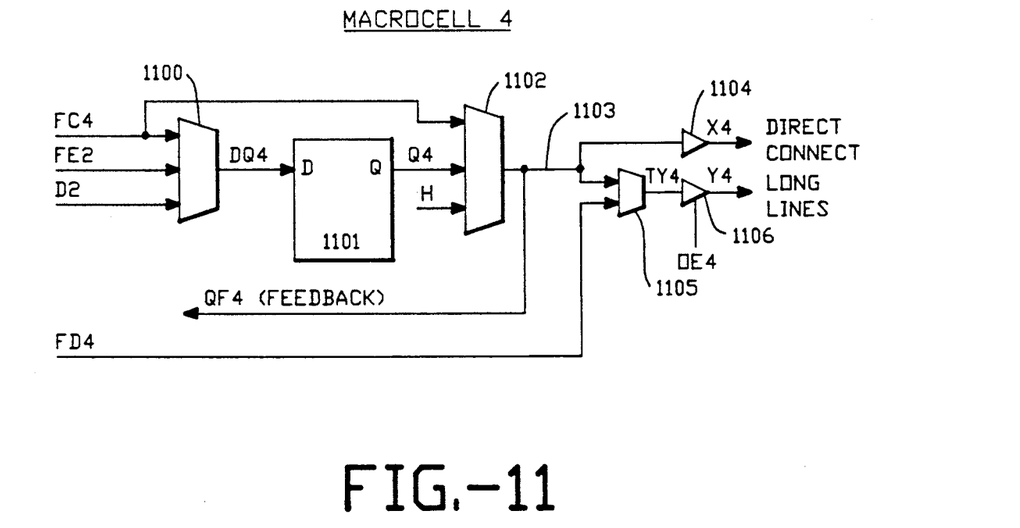
FIG. 11 is a schematic diagram of a fourth output macrocell in a configurable logic cell according to the present invention.

The output macrocell for the driving signals to outputs X4 and Y4 is shown in FIG. 11. It is similar to the macrocell of FIG. 10. The input signals include FC4, FE2, D2, H, and FD4 generated within the CLB. The signals FC4, FE2 and D2 are supplied through multiplexer 1100 to supply the signal DQDQ4. Signal DQ4 is supplied through register 901 to generate the output signal Q4. The output signal Q4 is supplied to multiplexer 902. Other inputs to multiplexer 902 include FC4 and H. The output of multiplexer 902 is the signal QF4 on line 1103 which is supplied as feedback and is coupled to buffer 1104 to drive the signal X4. The signal on line 1103 is also supplied to multiplexer 1105. A second input to multiplexer 1105 is the signal FD4. Multiplexer 1105 generates a signal TY4 which is coupled to the tristate buffer 1106. Tristate buffer 1106 is controlled by the signal OE4 and drives the output Y4 of the oonfigurable cell.

Note that the macrocells of FIGS. 10 and 11 provide for utilization of the registers 1001 and 1101 even if they are not used for driving the output of the combinational logic. This is provided by allowing the inputs D1 and D2 of the CLB to be directly coupled to the registers in the output macrocells.

Although not shown in FIGS. 8-11, each register includes a clock, clock enable and reset control. Furthermore, each of the multiplexers shown in the figures, unless a dynamic control signal is explicitly shown, is controlled by memory cells in the configuration program. Thus, the configuration of the macrocells is set during programming of the device.

Note also that the macrocell allows the output X1 and the output Y1 to be driven from different sources at the same time. This gives the oonfigurable logic block the ability to produce up to eight outputs at a time.

The Y1 through Y4 signals are each applied to drive eight bus lines in the interconnect through PIPs, one of which is an uncommitted long line. The outputs X1 through X4 provide a high speed signal path to adjacent and next adjacent oonfigurable logic cells or input/output cells in the array.

V. Output Enable Generator

Figure 12:
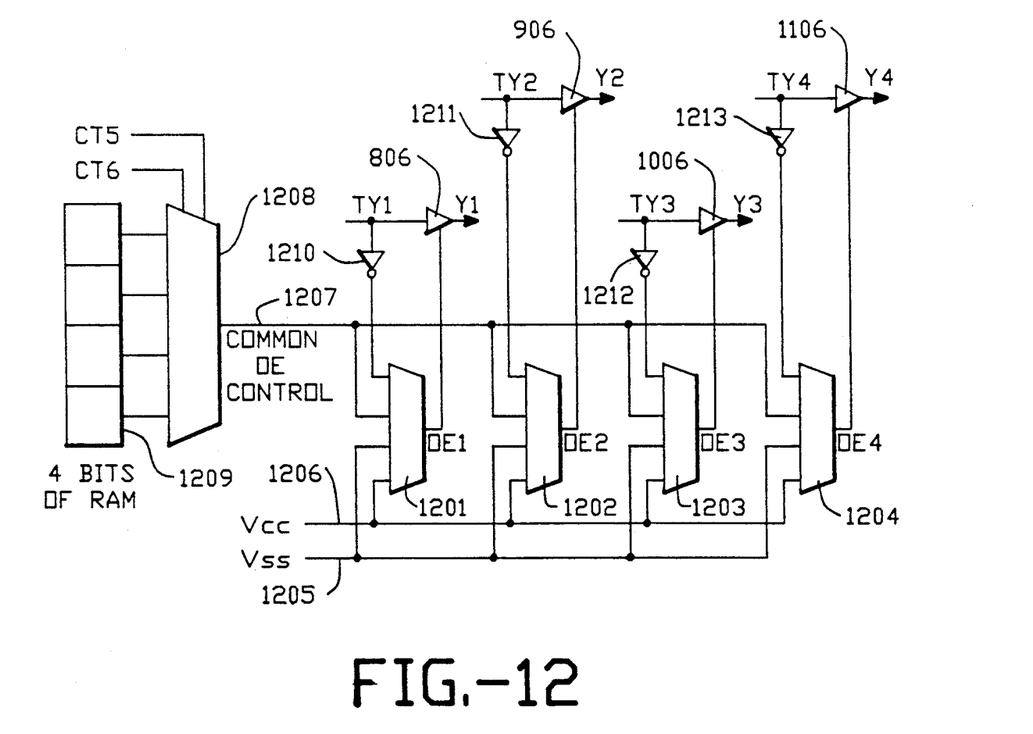
FIG. 12 is a schematic diagram illustrating a circuit for generation of the output enable signals for the respective output macrocells according to the present invention.

FIG. 12 illustrates the circuit for generating the output enable signals 0E1 through 0E4. In FIG. 12, the tristatable output buffers 806, 906, 1006 and 1106, generating the outputs Y1 through Y4, respectively, of the macrocells shown in FIGS. 8-11, respectively, are illustrated.

The circuit generating the output enable signals is based on a plurality of selectors, 1201, 1202, 1203 and 1204, which supply, at their respective outputs, the signals 0E1, 0E2, 0E3 and 0E4 to the tristatable output buffers. Each of the selectors, 1201, 1202, 1203, 1204, includes a plurality of inputs and supplies a signal from one of the plurality of inputs to its output in response to program data in the configuration memory. (not shown).

The inputs to the selectors include a first signal on line 1205 supplying a logic low level and a second signal on line 1206 supplying a logic high level. Also, each of the selectors 1201-1204 is connected to a common 0E control line 1207. The signal on the common 0E control line is supplied at the output of selector 1208 which is controlled in response to control signal CT5 and CT8 which are generated in the configurable logic cell in response to inputs from the configurable interconnect and to the program data in the configuration memory. The inputs to the selector 1208 are 4 bits of RAM 1209 of the configuration memory.

The fourth input to each of the plurality of selectors 1201-1204 is supplied to enable the tristatable buffer to operate as a connection to a wired-AND line. This fourth input for selector 1201 is supplied at the output of invertor 1210. The input of invertor 1210 is connected to receive the signal TY1, which is also supplied as input to the tristatable output buffer 806.

The fourth input to selector 1202 is supplied at the output of invertor 1211, which receives as input the signal TY2, which is also connected as input to the tristatable buffer 906.

The fourth input of the selector 1203 is supplied at the output of invertor 1212 which receives as input the signal TY3 which is also connected as input to the tristatable buffer 1006.

The fourth input to selector 1204 is supplied at the output of invertor 1213 which receives as input the signal TY4 which is also connected as input to the tristatable buffer 1106.

The circuit supplying the output enable signals, shown in FIG. 12, provides the ability to individually configure the output macrocells in each configurable logic cell in the array. Each of the cells, in response to the program data controlling the respective selectors, can operate in one of four states. In the first state, the tristate buffer is permanently enabled. In the second state, the tristate buffer is permanently tristated. In the third state, the tristate buffer is dynamically controlled in response to the common OE control signal on line 1207. In the fourth state, the tristate buffer operates for coupling the signal TY1 to the configurable interconnect in a wired-AND configuration.

The wired-AND configuration operates by connecting the output, such as Y1, to one of the long lines having a normally high state due to pull up resistors. The wired-AND configuration is accomplished by coupling a plurality of logic cells to a single line having normally high state with the tristatable output buffer coupled in the wired-AND configuration. In this case, if the input TY1 is high, the inverse of TY1 is selected as the output enable signal 0E1 and tristates the output buffer. Because the line is in a normally high state, the tristated buffer has the same effect on the line as supplying a logic 1. If a logic 0 is supplied at the signal TY1, the inverse is supplied as signal 0E1, enabling the output buffer 806. This presents the logic 0 on the output Y1 and pulls down the line. Thus, the wired-AND configuration accomplishes the AND logic function for a potentially large number of outputs from the configurable logic cells, without the use of an additional gate. Other wired-logic functions, such as wired-NAND or wired-OR, could be implemented as well using other techniques.

VI. Conclusion

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. An integrated circuit comprising a configuration memory including a plurality of storage elements storing program data specifying a user defined data processing function, an interconnect structure including a conductive line, and a plurality of configurable logic elements coupled to the configuration memory and to the interconnect structure, wherein said conductive line has a normally high state and wherein each member of a subset of the plurality of configurable logic elements comprises:
   input means for receiving a set of K input signals from the interconnect structure;
   logic means, coupled to the input means and the configuration memory, for generating a set of P signals in response to a first subset of the set of K input signals and the program data in the configuration memory; and
   output means, coupled to the logic means and having at least one output connected to the conductive line having a normally high state, for connecting an output signal from the set of P signals to the conductive line in a wired-logic configuration.

2. The integrated circuit of claim 1, wherein the output means in each member of the subset of configurable logic elements comprises,
   a tristate output buffer, having an input, an output connected to the conductive line and an output enable input, and receiving at the input one of the set of P signals, for supplying the output signal to the output or presenting a high impedance state on the output in response to an output enable signal connected to the output enable input; and
   means, connected to the input of the tristate output buffer, and to the output enable input, for supplying the output enable signal, in response to a signal at the input of the tristate output buffer.

3. The integrated circuit of claim 2, wherein the means for coupling in the output means of each member of the subset of configurable logic elements comprises:
   means, connected to the configuration memory and to a second subset of the set of K input signals, for generating a common output enable signal in response to the second subset of the set of K input signals and program data in the configuration memory;
   means, connected to the input of the tristate output buffer, for generating a wired-AND enable signal in response to signals on the input; and
   selecting means, having a plurality of inputs including a first input and a second input, and having an output, the output connected to the output enable input of the tristate output buffer, the first input receiving the common output enable signal, and the second input receiving the wired-AND enable signal, and coupled to the configuration memory, for connecting one of the plurality of inputs to the output in response to the program data in the configuration memory.

4. The integrated circuit of claim 3, wherein the plurality of inputs to the selecting means further includes a third input connected to a constant logic level signal.

5. The integrated circuit of claim 3, wherein the plurality of inputs to the selecting means further includes a third input connected to a constant high logic level signal, and a fourth input connected to a constant low logic level signal.

6. An integrated circuit according to claim 1 wherein:
   the first recited conductive line of the interconnect structure extends across the integrated circuit in a first direction and the interconnect structure further includes a second conductive line extending across the integrated circuit in a second, different direction;
   the second conductive line has a normally high state; and
   the output means of at least one of said plurality of configurable logic elements has at least a second output connected to the second conductive line for connecting an output signal from the set of P signals produced by the logic means of that at least one configurable logic element to the second conductive line in a wired-logic configuration.

7. An integrated circuit according to claim 1 wherein:
   the interconnect structure includes a plurality of conductive lines extending symmetrically across the integrated circuit in at least first and second different directions;
   each conductive line has a normally high state;
   the plurality of configurable logic elements are distributed across the integrated circuit symmetrically with respect to the plurality of conductive lines; and the output means of each configurable logic element includes two or more outputs connected to a respective two or more, differently directed conductive lines for connecting corresponding output signals from the step of P signals produced by the logic means of that configurable logic element to the respective two or more of the conductive lines in a wired-logic configuration.

8. An integrated circuit comprising a configuration memory including a plurality of storage elements storing program data specifying a user defined data processing function, a configurable interconnect structure including a plurality of conductive lines and programmable interconnect points, and a plurality of configurable logic elements coupled to the configuration memory and to the interconnect structure, wherein each member of a subset of the plurality of configurable logic elements comprises:

input means for supplying a set of K input signals from the interconnect structure;

logic means, coupled to the input means and the configuration memory, for generating a set of P signals in response to a first subset of the set of K input signals and the program data in the configuration memory; and output means, coupled to the logic means and having at least one output connected to the configurable interconnect structure, for connecting an output signal from the set of P signals to the configurable interconnect structure, including a plurality of tristate output buffers, each having an input, an output connected to the configurable interconnect structure, and an output enable input, and receiving at the input one of the set of P signals, for supplying the output signal to the output or presenting a high impedance state on the output in response to an output enable signal connected to the output enable input, means, connected to the configuration memory and to a second subset of the set of K input signals, for generating a common output enable signal in response to the second subset of the set of K input signals and program data in the configuration memory, and a plurality of selecting means, each having a plurality of inputs including a first input and a second input, and having an output, the output connected to the output enable input of a respective one of the plurality of tristate output buffers, the first input receiving the common output enable signal, and the second input receiving a second enable signal, and coupled to the configuration memory, for connecting one of the plurality of inputs to the output in response to the program data in the configuration memory.

9. The integrated circuit of claim 8, wherein the output means in each of the members of the subset further includes:

a plurality of inverting means, each connected to the input of a respective tristate output buffer, for inverting signals on the input of the respective tristate output buffer to generate the second enable signal for the selecting means that has an output connected to the output enable input of the respective tristate output buffer.

10. The integrated circuit of claim 8, wherein the output means in each of the subset of the plurality of configurable logic cells includes a plurality of means, each connected to the input of a corresponding tristate output buffer and to one of the plurality of selecting means supplying the output enable signal to the corresponding tristate output buffer, for supplying the second enable signal in response to a signal at the input of the corresponding tristate output buffer.

11. The integrated circuit of claim 10, wherein the plurality of inputs to at least one of the selecting means further includes a third input connected to a constant logic level signal.

12. The integrated circuit of claim 10, wherein the plurality of inputs to at least one of the selecting means further includes a third input connected to a constant high logic level signal and a fourth input connected to a constant low logic level signal.

13. A configurable logic array, comprising:

configuration storage means for storing program data specifying a user defined data processing function;

a plurality of configurable logic means $CL_{c,r}$, arranged in an array consisting of C columns and R rows, where c designates a column in the range 1 to C, and r designates a row in the range 1 to R, each of the configurable logic means $CL_{c,r}$ having a plurality of inputs and outputs, and coupled to the configuration storage means, for generating cell output signals at the respective plurality of outputs in response to cell input signals supplied to the respective plurality of inputs and in response to program data in the configuration storage means;

a plurality of oonfigurable input/output means, each coupled to an input/output pad and having an input and an output, and coupled to the configuration storage means, for providing configurable interfaces between the respective input/output pads and the respective inputs and outputs in response to program data in the configuration storage means;

configurable interconnect means, coupled to the plurality of oonfigurable logic means, the plurality of configurable input/output means and the configuration storage means, for connecting inputs and outputs of configurable logic means and configurable input/output means into logioal networks in response to program data in the configuration storage means;

wherein eaoh member of a subset of the configurable logical means includes output means, having at least one output connected to the configurable interconnect means, for connecting in response to program data in the configuration storage means, at least one cell output signal to the configurable interconnect means in a wired-logic configuration.

14. The configurable logic array of claim 13, wherein the configurable interconnect means includes a conductive line, and the output means in each member of the subset of oonfigurable logic means comprises:

a tristate output buffer, having an input receiving a logic signal from the oonfigurable logic means, an output connected to the conductive line in the configurable interconnect means and an output enable input, for supplying the logic signal to the output or presenting a high impedance state on the output in response to an output enable signal connected to the output enable input; and means, connected to the input of the tristate output buffer, and to the output enable input, for supplying the output enable signal in response to the logic signal received at the input of the tristate output buffer.

15. The configurable logic array of claim 14, wherein the means for coupling in the output means of each member of the subset of configurable logic means comprises:
   means, connected to the configuration storage means, for generating a common output enable signal in response to the cell input signals and program data in the configuration storage means;
   means, connected to the input of the tristate output buffer, for inverting the logic signal on the input to generate a wired-AND enable signal; and
   selecting means, having a plurality of inputs including a first input and a second input, and having an output, the output connected to the output enable input of the tristate output buffer, the first input receiving the common output enable signal, and the second input receiving the wired-AND enable signal, and coupled to the configuration storage means, for connecting one of the plurality of inputs to the output in response to the program data in the configuration storage means.

16. The configurable logic array of claim 15, wherein the plurality of inputs to the selecting means further includes a third input connected to a constant logic level signal.

17. The configurable logic array of claim 15, wherein the plurality of inputs to the selecting means further includes a third input oonneoted to a constant high logic level signal, and a fourth input connected to a constant low logic level signal.

18. The configurable logic array of claim 13, wherein the output means in eaoh member of the subset of configurable logic means comprises:
   a plurality of tristate output buffers, each having an input receiving a logic signal from the configurable logic means, an output connected to a conductive line having a normally high state in the configurable interconnect means and an output enable input, for supplying the logic signal to the output or presenting a high impedance state on the output in response to an output enable signal connected to the output enable input; and
   a plurality of means, eaoh connected to the input and the output enable input of a respective tristate output buffer, for supplying the output enable signal in response to the logic signal received at the input of the respective tristate output buffer.

19. The configurable logic array of claim 18, wherein the output means in each member of the subset of configurable logic means includes;
   means, connected to the configuration storage means, for generating a common output enable signal in response to the cell input signals and program data in the configuration storage means;
   and wherein eaoh of the means for coupling comprises:
   means, oonneoted to the input of the respective tristate output buffer, for inverting the logic signal on the input to generate a respective Wired-AND enable signal; and
   selecting means, having a plurality of inputs including a first input and a second input, and having an output, the output connected to the output enable input of the respective tristate output buffer, the first input receiving the common output enable signal, and the second input receiving the respective wired-AND enable signal, and coupled to the configuration storage means, for connecting one of the plurality of inputs to the output in response to the program data in the configuration storage means.

20. The configurable logic array of claim 19, wherein the plurality of inputs to the each of the selecting means further includes a third input connected to a constant logic level signal.

21. The configurable logic array of claim 19, wherein the plurality of inputs to the each of the selecting means further includes a third input connected to a oonstant high logic level signal, and a fourth input connected to a oonstant low logic level signal.

22. A configurable logic array comprising:
   a substrate;
   a plurality of logic areas defined on the substrate, each logic area having a perimeter and a programmable logic circuitry positioned within the perimeter for performing logic operations therein in accordance with user-provided configuration data; and
   an interconnect network defined on the substrate for carrying signals between the logic areas;
   wherein the interconnect network comprises a plurality of interconnect lines, said interconnect lines including a plurality long lines which extend across the substrate in different first and second directions and a plurality of substantially shorter interconnect segments which also extend across the substrate;
   wherein at least a first of the long lines extending across the substrate in the first direction and at least a second of the long lines extending across the substrate in the second direction are each normally pulled to a first logic state;
   wherein a first set of said logic areas are coupled to the first of the long lines in a wired-logic fashion such that an output signal produced by the programmable logic circuitry of any one of the first set of said logic areas is able to switch the first of the long lines from its normal first logic state to a second, different logic state; and
   wherein a second set of said logic areas are coupled to the second of the long lines in a wired-logic fashion such that an output signal produced by the programmable logic circuitry of any one of the second set of said logic areas is able to switch the second of the long lines from its normal first logic state to a second, different logic state.

23. The configurable logic array of claim 22 wherein said logic areas are arranged to define a rectangular matrix and each long line extends a distance corresponding approximately to that separating two opposing sides of the matrix.

* * * * *

UNITED STATES PATENT AND TRADEMARK OFFICE
CERTIFICATE OF CORRECTION

PATENT NO. : 5,185,706               Page 1 of 2
DATED     : February 9, 1993
INVENTOR(S) : Om P. Agrawal, Michael J. Wright It is certified that error appears in the above-identified patent and that said Letters Patent is hereby corrected as shown below:

```
Column 2, line 30, delete "oonfigurable" and insert
                  --configurable--.
          line 53, delete "oonfigurable" and insert
                  --configurable--.
Column 3, line 38, delete "oonfigurable" and insert
                  --configurable--.
Column 4, line 1, between "bus and" insert --1--.
          line 19, delete "oonfigurable" and insert
                  --configurable--.
          line 49, delete "oonfigurable" and insert
                  --configurable--.
Column 6, line 53, delete "oonfigurable" and insert
                  --configurable--.
Column 7, line 58, delete "oonfigurable" and insert
                  --configurable--.
Column 8, line 7, delete "oonfigurable" and insert
                  --configurable--.
          line 13, delete "oonfigurable" and insert
                  --configurable--.
Column 10, line 3, after "comprises" delete "," and insert --:--.
Column 11, line 7, delete "step" and insert --set--.
Column 12, line 18, after "signal" insert --,--.
          line 34, delete "oonfigurable" and insert
                  --configurable--.
          line 43, delete "oonfigurable" and insert
                  --configurable--.
          line 47, delete "logioal" and insert --logical--.
          line 50, delete "eaoh" and insert --each--.
          line 60, delete "oonfigurable" and insert
                  --configurable--.
          line 62, delete "oonfigurable" and insert
                  --configurable--.
```

UNITED STATES PATENT AND TRADEMARK OFFICE
CERTIFICATE OF CORRECTION

PATENT NO. : 5,185,706

DATED : February 9, 1993

INVENTOR(S) : Om P. Agrawal, Michael J. Wright

It is certified that error appears in the above-identified patent and that said Letters Patent is hereby corrected as shown below:

```
Column 13, line 33, delete "oonneoted" and insert --connected--.
          line 37, delete "eaoh" and insert --each--.
          line 48, delete "eaoh" and insert --each--.
          line 60, delete "eaoh" and insert --each--.
          line 62, delete "oonneoted" and insert --connected--.
Column 14, line 1, delete "Wired" and insert --wired--.
          line 20, delete "oonstant" and insert --constant--.
          line 22, delete "oonstant" and insert --constant--.
          line 26, after "and" delete "a".
```

Signed and Sealed this

Sixteenth Day of November, 1993

*Attest:*

BRUCE LEHMAN

*Attesting Officer*     *Commissioner of Patents and Trademarks*